(12) United States Patent
Kim et al.

(10) Patent No.: US 8,860,119 B2
(45) Date of Patent: Oct. 14, 2014

(54) NONVOLATILE MEMORY DEVICE AND METHOD FOR FABRICATING THE SAME

(75) Inventors: Min-Soo Kim, Gyeonggi-do (KR); Dong-Sun Sheen, Gyeonggi-do (KR); Seung-Ho Pyi, Gyeonggi-do (KR); Sung-Jin Whang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 42 days.

(21) Appl. No.: 13/604,073

(22) Filed: Sep. 5, 2012

(65) Prior Publication Data

US 2013/0168752 A1    Jul. 4, 2013

(30) Foreign Application Priority Data

Dec. 28, 2011 (KR) .................. 10-2011-0145056

(51) Int. Cl.
*H01L 29/78* (2006.01)
*H01L 21/283* (2006.01)

(52) U.S. Cl.
USPC ........................................ 257/314; 438/519

(58) Field of Classification Search
CPC ............. H01L 27/115; H01L 27/11521; H01L 27/11568; H01L 21/28273; H01L 29/66825
USPC .............. 438/591; 257/314, E29.255, E21.18
See application file for complete search history.

(56) References Cited

U.S. PATENT DOCUMENTS

| | | | |
|---|---|---|---|
| 6,780,694 B2 | 8/2004 | Doris et al. | |
| 7,629,630 B2 * | 12/2009 | Lane | 257/256 |
| 8,236,650 B2 * | 8/2012 | Son et al. | 438/268 |

FOREIGN PATENT DOCUMENTS

| | | |
|---|---|---|
| JP | 2004111661 | 4/2004 |
| KR | 1020040011875 | 2/2004 |
| KR | 1020060067372 | 6/2006 |
| KR | 100607656 | 8/2006 |
| KR | 1020090106705 | 10/2009 |
| KR | 101010946 | 1/2011 |

* cited by examiner

*Primary Examiner* — Matthew W Such
*Assistant Examiner* — Monica D Harrison
(74) *Attorney, Agent, or Firm* — IP & T Group LLP

(57) ABSTRACT

A nonvolatile memory device includes a substrate including a surface, a channel layer formed on the surface of the substrate, which protrudes perpendicularly from the surface, and a plurality of interlayer dielectric layers and a plurality of gate electrode layers alternately stacked along the channel layer, wherein the plurality of gate electrode layers protrude from the plurality of interlayer dielectric layers.

16 Claims, 20 Drawing Sheets

NONVOLATILE MEMORY DEVICE AND METHOD FOR FABRICATING THE SAME

CROSS-REFERENCE TO RELATED APPLICATIONS

The present application claims priority of Korean Patent Application No. 10-2011-0145056, filed on Dec. 28, 2011, which is incorporated herein by reference in its entirety.

BACKGROUND

1. Field

Exemplary embodiments of the present invention relate to a nonvolatile memory device and a method for fabricating the same, and more particularly, to a 3D nonvolatile memory device including a plurality of memory cells stacked perpendicular to a surface of a substrate and a method for fabricating the same.

2. Description of the Related Art

A nonvolatile memory device maintains data stored therein although power is turned off. Currently, various nonvolatile memory devices, such as a flash memory, are widely used.

In particular, as the improvement in the degree of integration of 2D nonvolatile memory devices, including a plurality of memory cells formed in a single layer over a semiconductor substrate, approaches the limits, a 3D nonvolatile memory device, including a plurality of memory cells formed along a channel layer protruding perpendicularly from a surface of a semiconductor substrate, has been proposed.

FIG. 1 is a cross-sectional view of a conventional 3D nonvolatile memory device.

Referring to FIG. 1, the 3D nonvolatile memory device may include a word line WL extending in one direction while surrounding a channel layer CH protruding vertically from a substrate.

Although not illustrated in FIG. 1, the word line WL may be formed by the following process: a plurality of sacrificial layers are removed from a structure in which a plurality of interlayer dielectric layers and the plurality of sacrificial layers are alternately stacked along the channel layer CH. A conductive material is deposited to such a thickness as to fill the space from which the sacrificial layers is were removed, and an etching process for etching the deposited conductive material for the respective layers is performed. At this time, line or dot-shaped voids may be formed in the word line WL, and may serve as a factor that increases the resistance of the word line WL.

In particular, during the etching process, the conductive material is further etched at a top word line WL than a bottom word line WL. Therefore, the top of the word line WL is formed to have a smaller volume than the bottom of the word line WL. Accordingly, the top of the word line WL has a relatively large resistance value. Furthermore, the conductive material may be excessively etched to open the word line WL (refer to symbol A), or the resistance of the word line WL may rapidly increase (refer to symbol B). Therefore, there is demand for the development of a structure capable of solving such concerns.

SUMMARY

An exemplary embodiment of the present invention is directed to a nonvolatile memory device and a method for fabricating the same, which is capable of increasing the volume of a gate electrode layer without an electrical bridge between gate electrode layers, thereby reducing the resistance of the gate electrode layer.

In accordance with an exemplary embodiment of the present invention, a nonvolatile memory device includes a substrate including a surface, a channel layer formed on the surface of the substrate, which protrudes perpendicularly from the surface, and a plurality of interlayer dielectric layers and a plurality of gate electrode layers alternately stacked along the channel layer, wherein the plurality of gate electrode layers protrude from the plurality of interlayer dielectric layers.

In accordance with another embodiment of the present invention, a method for fabricating a nonvolatile memory device includes, alternately stacking a plurality of interlayer dielectric layers and a plurality of sacrificial layers over a substrate, forming a channel hole by selectively etching the plurality of interlayer dielectric layers and the plurality of sacrificial layers, forming a channel layer in the channel hole, forming a slit hole adjacent to the channel hole so that the slit hole passes through the plurality of interlayer dielectric layers and the plurality of sacrificial layers, removing the plurality of sacrificial layers exposed through the slit hole to form a plurality of spaces, forming a first gate electrode layer in each of the plurality of spaces, and forming a plurality of second gate electrode layers, each coupled to a corresponding first gate electrode layer, so that each of the plurality of second gate electrode layers protrudes from the plurality of interlayer dielectric layers.

DETAILED DESCRIPTION

Figure 1:
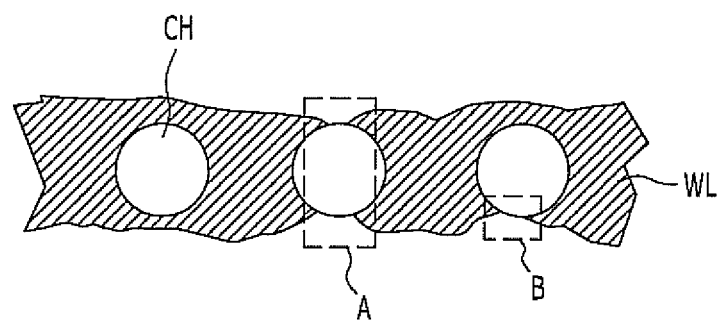
FIG. 1 is a cross-sectional view of a conventional 3D nonvolatile memory device.

Exemplary embodiments of the present invention will be described below in more detail with reference to the accompanying drawings. However, the present invention may be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2A:
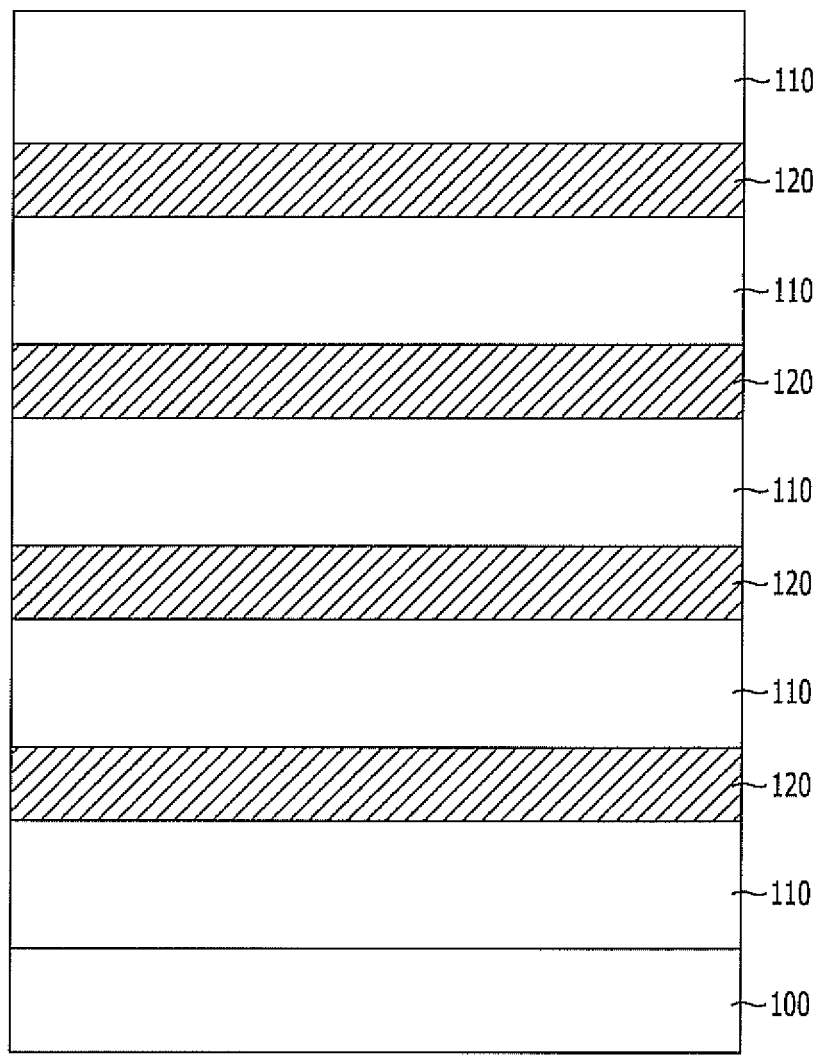
FIGS. 2A to 2F are cross-sectional views explaining a nonvolatile memory device and a method for fabricating the same in accordance with a first embodiment of the present invention.
Figure 2B:
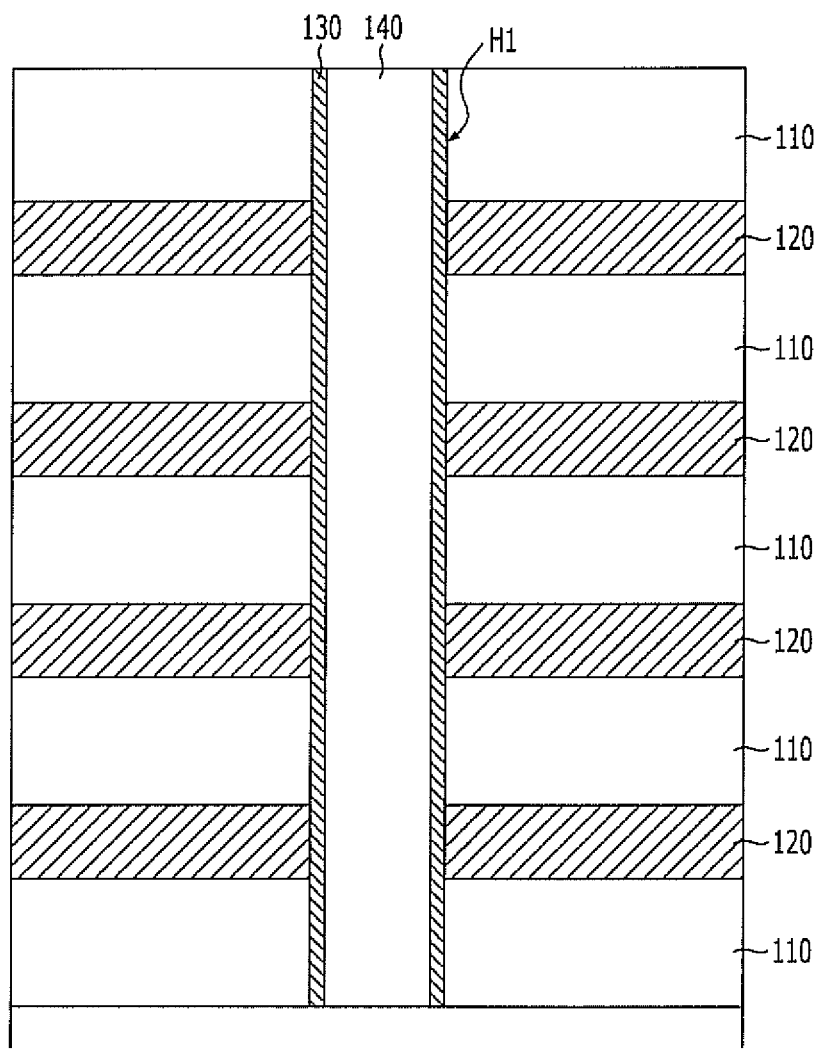
Figure 2C:
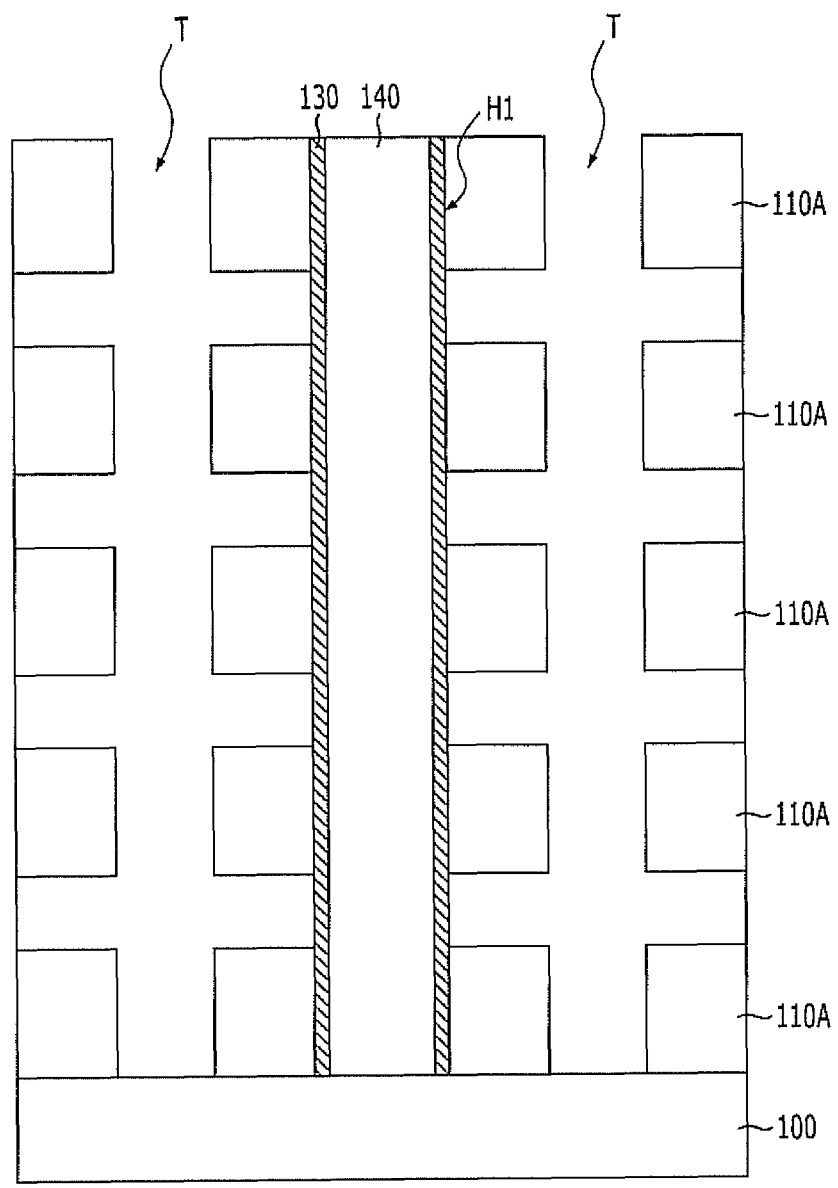
Figure 2D:
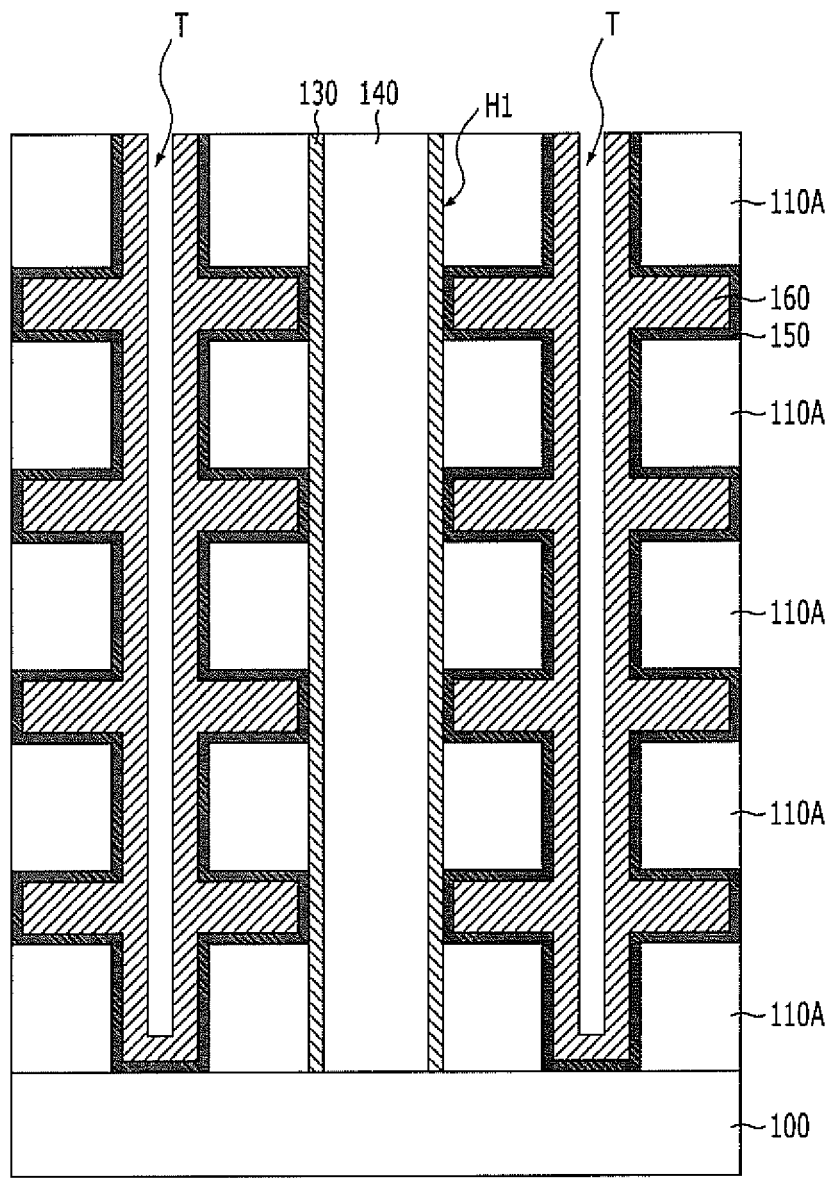
Figure 2E:
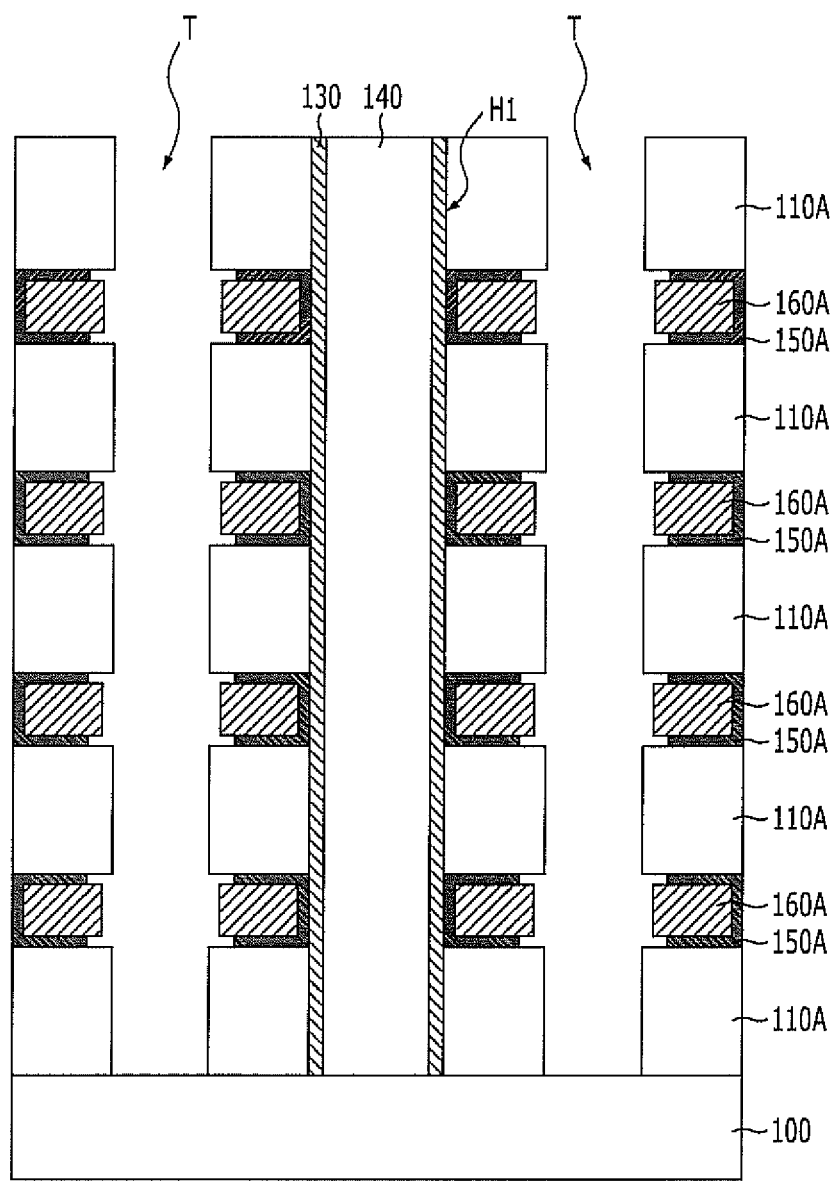
Figure 2F:
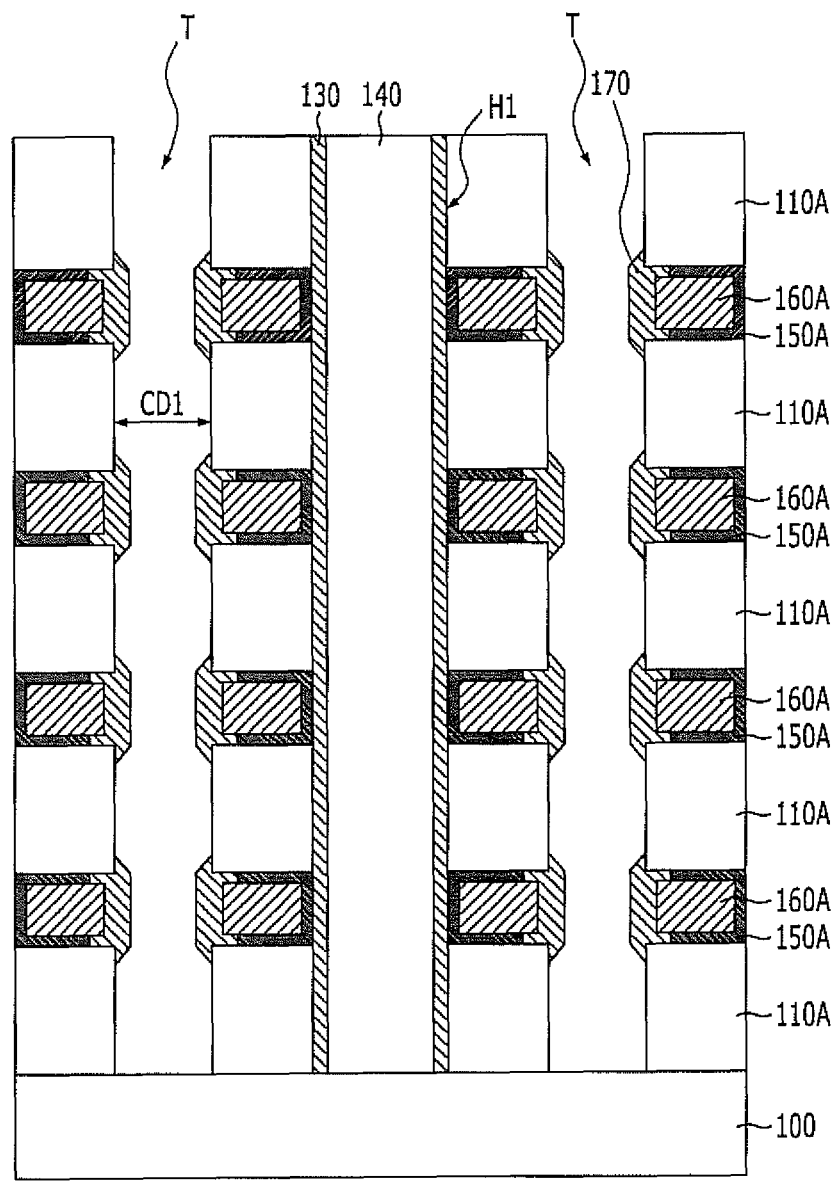

FIGS. 2A to 2F are cross-sectional views explaining a nonvolatile memory device and a method for fabricating the same in accordance with a first embodiment of the present invention. In particular, FIG. 2F is a cross-sectional view of the nonvolatile memory device in accordance with the first embodiment of the present invention, and FIGS. 2A to 2E are cross-sectional views illustrating intermediate processes for fabricating the nonvolatile memory device of FIG. 2F.

Referring to FIG. 2A, a plurality of interlayer dielectric layers 110 and a plurality of sacrificial layers 120 are alternately stacked over a substrate 100. The substrate 100 may include a semiconductor substrate such as single crystal silicon, and may have a given lower structure (not illustrated). Hereinafter, the structure in which the plurality of interlayer dielectric layers 110 and the plurality of sacrificial layers 120 are alternately stacked is referred to as a gate structure, for convenience of description.

Here, the interlayer dielectric layer 110 may be disposed at the lowermost part and the uppermost part of the gate structure, and may be formed of an oxide-based material such as silicon oxide ($SiO_2$). Furthermore, the sacrificial layer 120 is removed during a subsequent process, and may provide a space in which a gate electrode layer (to be described below) is to be formed. The sacrificial layer 120 may be formed of a material (e.g., a nitride-based material) having an etching selectivity that is substantially the same as the etching selectivity of the interlayer dielectric layer 110. FIG. 2A illustrates four sacrificial layers 120. However, this is only an example, and four or more sacrificial layers or three or less sacrificial layers may be formed.

Referring to FIG. 2B, the gate structure is selectively etched to form a channel hole H1 exposing the substrate 100. The channel hole H1 may have a circular or elliptical shape, when seen from the top. In this embodiment of the present invention, a plurality of channel holes H1 may be arranged in a matrix shape.

A memory layer 130 is formed on the sidewall of the channel hole H1, and a channel layer 140 is formed in the channel hole H1 having the memory layer 130 formed therein.

Here, the memory layer 130 may be formed by sequentially depositing a charge blocking layer, a charge trap layer, and a tunnel insulation layer. The tunnel insulation layer serves to tunnel charges, and may be formed of oxide, for example. The charge trap layer serves to trap charges to store data, and may be formed of nitride, for example. The charge blocking layer serves to block the charges within the charge trap layer from moving to the outside, and may be formed of oxide, for example. That is, the memory layer 130 may have a triple layer structure of oxide-nitride-oxide (ONO).

Furthermore, the channel layer 140 may be formed of a semiconductor material, for example, polysilicon. Meanwhile, in this embodiment of the present invention, the channel layer 140 may be formed to such a thickness as to completely fill the channel hole H1, but the present invention is not limited thereto. In another embodiment of the present invention, the channel layer 140 may be formed to such a thickness as not to completely fill the channel hole H1.

Referring to FIG. 2C, the gate structure at both sides of the channel hole H1 is selectively etched to form a slit hole T passing through the interlayer dielectric layers 110 and the sacrificial layers 120 (not shown). At this time, a plurality of slit holes T may be formed in a slit shape extending in a direction crossing the cross-section of FIG. 2C, and arranged in parallel to each other.

The sacrificial layers 120 and interlayer dielectric layers 110, exposed through the slit hole T, are removed using a wet etching process. The remaining interlayer dielectric layer 110 is referred to as an interlayer dielectric layer pattern 110A.

Referring to FIG. 2D, a barrier metal layer 150 is formed along an inner wall of the slit hole T, in spaces formed when the sacrificial layers 120 were removed. The barrier metal layer 150 serves to improve interfacial characteristics between the interlayer dielectric layer pattern 110A, the memory layer 130, and a first gate electrode layer (to be described below). The barrier metal layer 150 may be formed by conformally depositing titanium nitride (TiN).

A first gate electrode conductive layer 160 is formed on the barrier metal layer 150 in the spaces formed when the sacrificial layers 120 were removed. The first gate electrode conductive layer 160 may be formed by depositing a conductive material, such as a metal, using, for example, atomic layer deposition (ALD) or chemical vapor deposition (CVD). For example, the first gate electrode conductive layer 160 may be formed by forming a tungsten (W) core and then depositing bulk tungsten.

Referring to FIG. 2E, the barrier metal layer 150 and the first gate electrode conductive layer 160 are separated into the respective layers by etching the barrier metal layer 150 and the first gate electrode conductive layer 160 in the slit hole T until side surfaces of the interlayer dielectric layer patterns 110A are exposed.

Here, the volume of the barrier metal layer 150, which has a relatively large resistance value, may be reduced as much as possible. The barrier metal layer 150 may be etched to a larger depth than the first gate electrode conductive layer 160, based on a difference in etch rate between the barrier metal layer 150 and the first gate electrode conductive layer 160. The etched barrier metal layer 150 and the etched first gate electrode conductive layer 160, both of which remain between the interlayer dielectric layer patterns 110A, are referred to as a barrier metal layer pattern 150A and a first gate electrode layer 160A, respectively.

Referring to FIG. 2F, a second gate electrode layer 170 is formed to cover the first gate electrode layer 160A. The second gate electrode layer 170 protrudes from the interlayer dielectric layer pattern 110A, and may have a larger width in a direction perpendicular to a surface of the substrate 100 than a width of the first gate electrode layer 160A.

In particular, the second gate electrode layer 170 may include a metal or the like, and may be formed by selectively depositing bulk tungsten without tungsten nucleation. Specifically, when the first gate electrode layer 160A is formed of tungsten, bulk tungsten is deposited on the already-formed tungsten layer, i.e., the first gate electrode layer 160A. Therefore, a separate mask process or gate electrode separation process is not necessary. Furthermore, when the selective deposition is used, it is possible to prevent an electrical bridge, between the second gate electrode layers 170, from being formed at minute intervals. Furthermore, influence by a loading effect may be minimized to uniformly deposit tungsten to the edge of a memory cell.

As the result of this process, a gate electrode layer, including the first gate electrode layer 160A and the second gate electrode layer 170 coupled to the first gate electrode layer 160A, is formed. In particular, as the second gate electrode layer 170 is formed, the volume reduction of the first gate electrode layer 160A, which was caused by the etching in the gate electrode separation process may be compensated, and voids formed in the first gate electrode layer 160A are filled with the second gate electrode layer 170. Accordingly, the resistance of the gate electrode layer may be reduced without change in critical dimension.

The nonvolatile memory device in accordance with the first embodiment of the present invention, as illustrated in FIG. 2F, may be fabricated by the above-described fabrication method.

Referring to FIG. 2F, the nonvolatile memory device, in accordance with the first embodiment of the present invention includes the channel layer 140 that protrudes perpendicular to the surface of the substrate 100, the plurality of interlayer dielectric layer patterns 110A and gate electrode layers, both of which are alternately stacked along the channel layer 140, the barrier metal layer patterns 150A interposed between the interlayer dielectric layer patterns 110A, the gate electrode layer, which may protrude from the interlayer dielectric layer patterns 110A, and the memory layer 130, interposed between the channel layer 140 and the gate electrode layers.

Here, each of the gate electrode layers may include the first gate electrode layer 160A, which is positioned between the interlayer dielectric layer patterns 110A, coupled to the second gate electrode layer 170, which protrudes from the interlayer dielectric layer patterns 110A. In particular, the second gate electrode layer 170 may be formed by selectively depositing tungsten, and may have a larger width in a direction perpendicular to the surface of the substrate 100 than the first gate electrode layer 160A.

Figure 3:
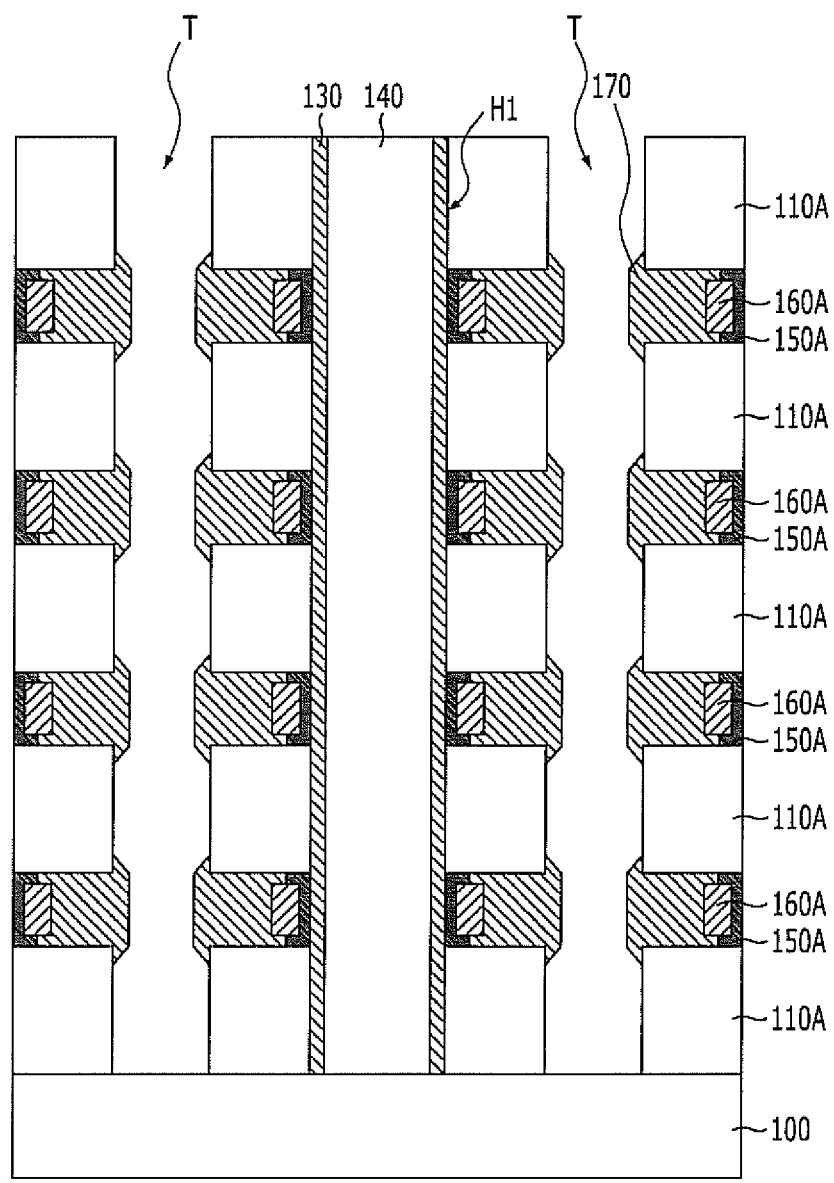
FIG. 3 is a cross-sectional view explaining a nonvolatile memory device and a method for fabricating the same in accordance with a second embodiment of the present invention.

FIG. 3 is a cross-sectional view explaining a nonvolatile memory device and a method for fabricating the same in accordance with a second embodiment of the present invention. In this embodiment of the present invention, the detailed descriptions of the same components as those of the first embodiment of the present invention will be omitted. First, the processes of FIGS. 2A to 2E are performed in the same manner as the first embodiment of the present invention, and a process of FIG. 3 is performed.

Referring to FIG. 3, the barrier metal layer pattern 150A and the first gate electrode layer 160A are partially etched, and a second gate electrode layer 170 is formed to cover the first gate electrode layer 160A. The second gate electrode layer 170 may protrude from the interlayer dielectric layer pattern 110A.

In particular, the second gate electrode layer 170 may include a metal or the like, and may be formed by selectively depositing bulk tungsten without tungsten nucleation. At this time, the second gate electrode layer 170 may have a larger volume than the first gate electrode layer 160A, and the volume of the barrier metal layer pattern 150A having a relatively large resistance value may be reduced as much as possible.

In the second embodiment of the present invention, the barrier metal layer pattern 150A and the first gate electrode layer 160A may be removed to a larger depth than in the first embodiment of the present invention, thereby increasing the volume of the second gate electrode layer 170, which has a relatively small resistance value. Accordingly, the resistance of the gate electrode layer may be reduced more than in the first embodiment of the present invention.

Figure 4A:
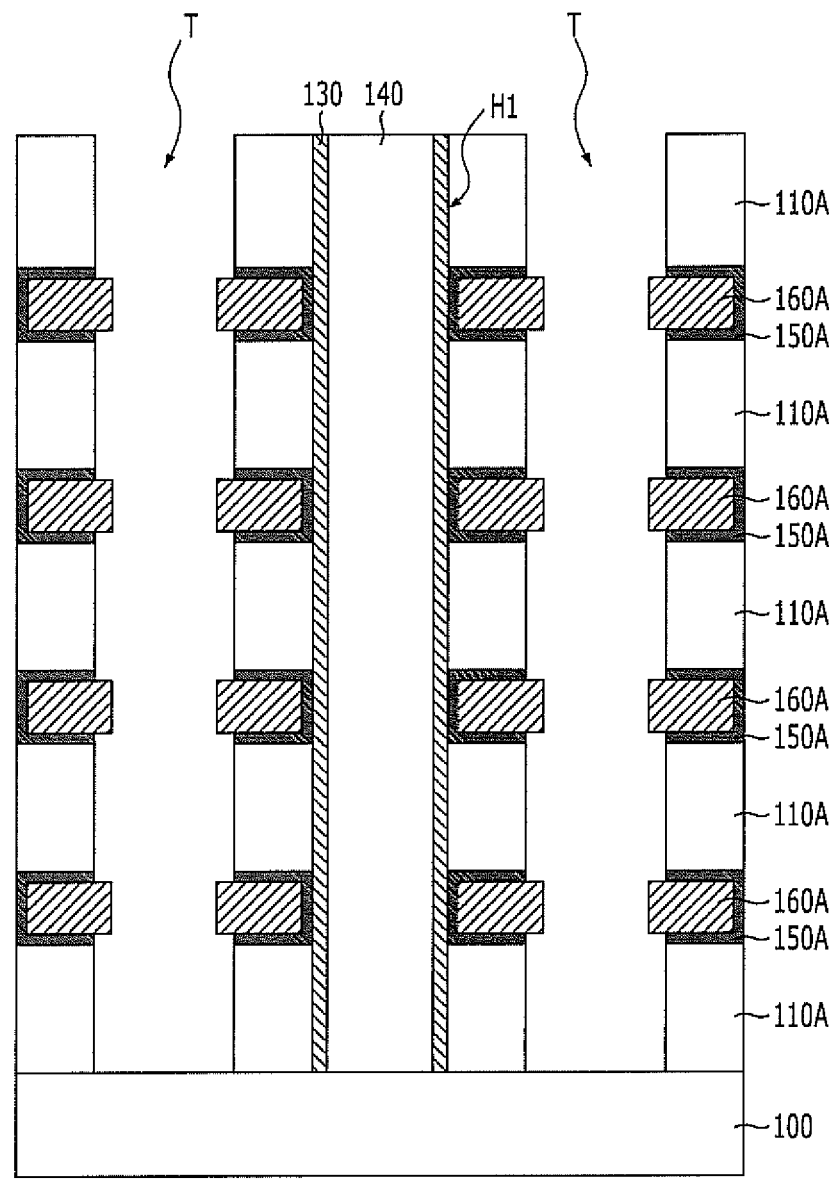
FIGS. 4A and 4b are cross-sectional views explaining a nonvolatile memory device and a method for fabricating the same in accordance with a third embodiment of the present invention.
Figure 4B:
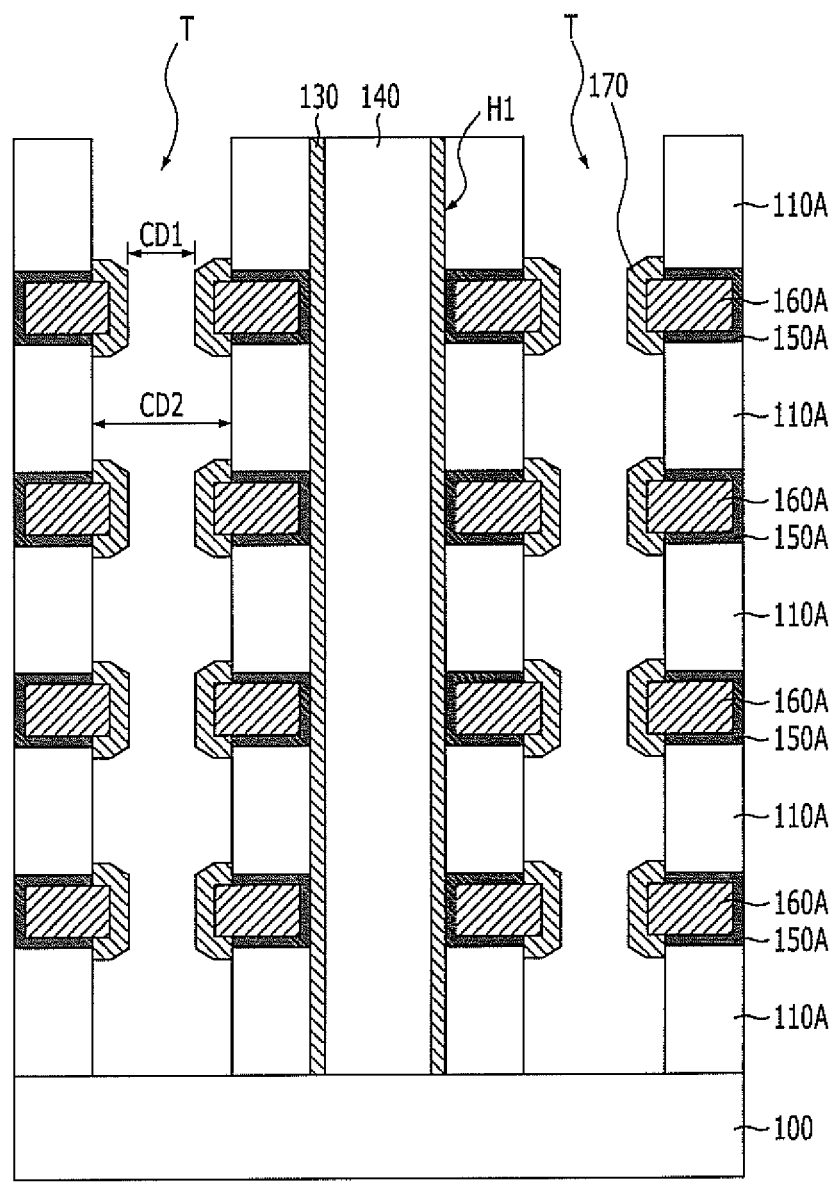

FIGS. 4A and 4b are cross-sectional views explaining a nonvolatile memory device and a method for fabricating the same in accordance with a third embodiment of the present invention. In this embodiment of the present invention, the detailed descriptions of the same components, as identified in the first embodiment of the present invention, will be omitted. First, the processes of FIGS. 2A to 2E are performed in the same manner as the first embodiment of the present invention, and processes of FIGS. 4A and 4B are performed.

Referring to FIG. 4A, the interlayer dielectric layer patterns 110A are partially removed to a given depth. As the result of this process, the first gate electrode layers 160A may protrude from the interlayer dielectric layer patterns 110A.

Referring to FIG. 4B, a second gate electrode layer 170 is formed to surround the protruding portion of the first gate electrode layer 160A. The second gate electrode layer 170 may include a metal or the like, and may be formed by selectively depositing bulk tungsten without tungsten nucleation. At this time, since the width of the slit hole T is increased from CD1 (as shown in FIG. 2F) to CD2 by the process of FIG. 4A, the volume of the second gate electrode layer 170 may be further increased.

In the third embodiment of the present invention, the first gate electrode layer 160A is formed to protrude from the interlayer dielectric layer pattern 110A, and the second gate electrode layer 170 is formed to surround the protruding portion of the first gate electrode layer 160A. Because the width of the silt hole T has been increased from CD1 to CD2, the volume of the second gate electrode layer 170 may be increased. This increase in volume of the second gate electrode layer 170 makes it possible to further reduce the resistance of the gate electrode layer than in the first embodiment of the present invention.

FIGS. 5A to 5H are cross-sectional views explaining a nonvolatile memory device and a method for fabricating the same in accordance with a fourth embodiment of the present invention. In this embodiment of the present invention, the detailed descriptions of the same components, as identified in the first embodiment of the present invention, will be omitted.

Figure 5A:
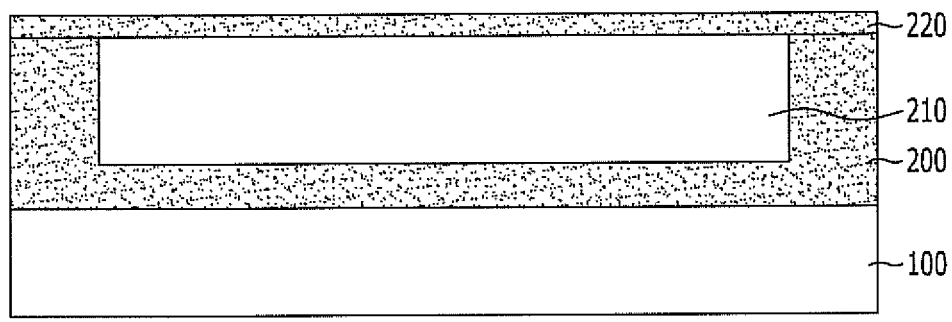
FIGS. 5A to 5H are cross-sectional views explaining a nonvolatile memory device and a method for fabricating the same in accordance with a fourth embodiment of the present invention.

Referring to FIG. 5A, a first pass gate electrode layer 200 is formed over a substrate 100. The substrate 100 may include a semiconductor substrate such as single crystal silicon, and the first pass gate electrode layer 200 may be formed of a conductive material, for example, doped polysilicon or metal.

The first pass gate electrode layer 200 is selectively etched to form a groove, and a sacrificial layer pattern 210 is formed in the groove.

Here, the sacrificial layer pattern 210 is removed during a subsequent process, and provides a space where a sub-channel hole (to be described below) is to be formed. The sacrificial layer pattern 210 may be formed of a material having an etching selectivity that is substantially the same as the etching selectivity of the first and second pass gate electrode layers 200 and 220 and of an interlayer dielectric layer 110 and a sacrificial layer all of which will be described below. Furthermore, the sacrificial layer pattern 210 may be arranged in a matrix shape having a major axis in the cross-sectional direction of FIG. 5A and a minor axis in a direction crossing the cross-sectional direction.

The second pass gate electrode layer 220 is formed over the first pass gate electrode layer 200 and the sacrificial layer pattern 210. The second pass gate electrode layer 220 may be formed of a conductive material, for example, doped polysilicon or metal. Meanwhile, the first and second pass gate electrode layers 200 and 220 may surround the sacrificial layer pattern 210, and function as a gate electrode of a pass transistor.

Figure 5B:
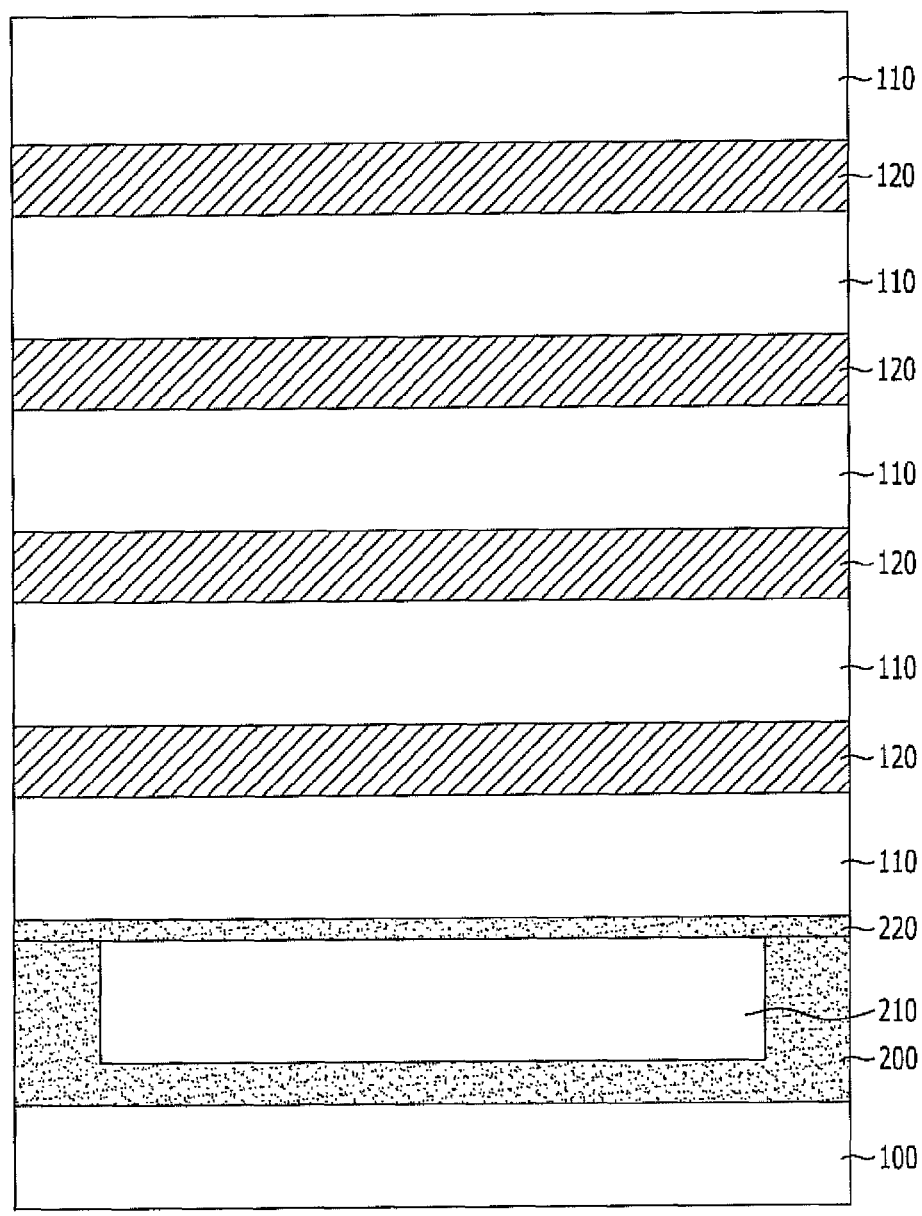

Referring to FIG. 5B, a plurality of interlayer dielectric layers 110 and a plurality of sacrificial layers 120 are alternately stacked over the second pass gate electrode layer 220.

Here, the interlayer dielectric layer 110 may be formed of an oxide-based material. The sacrificial layer 120 is removed during a subsequent process and provides a space where a gate electrode (to be described below) is to be formed. The sacrificial layer 120 may be formed of a material (e.g., a nitride-based material) having an etching selectivity that is substantially the same as the etching selectivity of the interlayer dielectric layer 110.

Figure 5C:
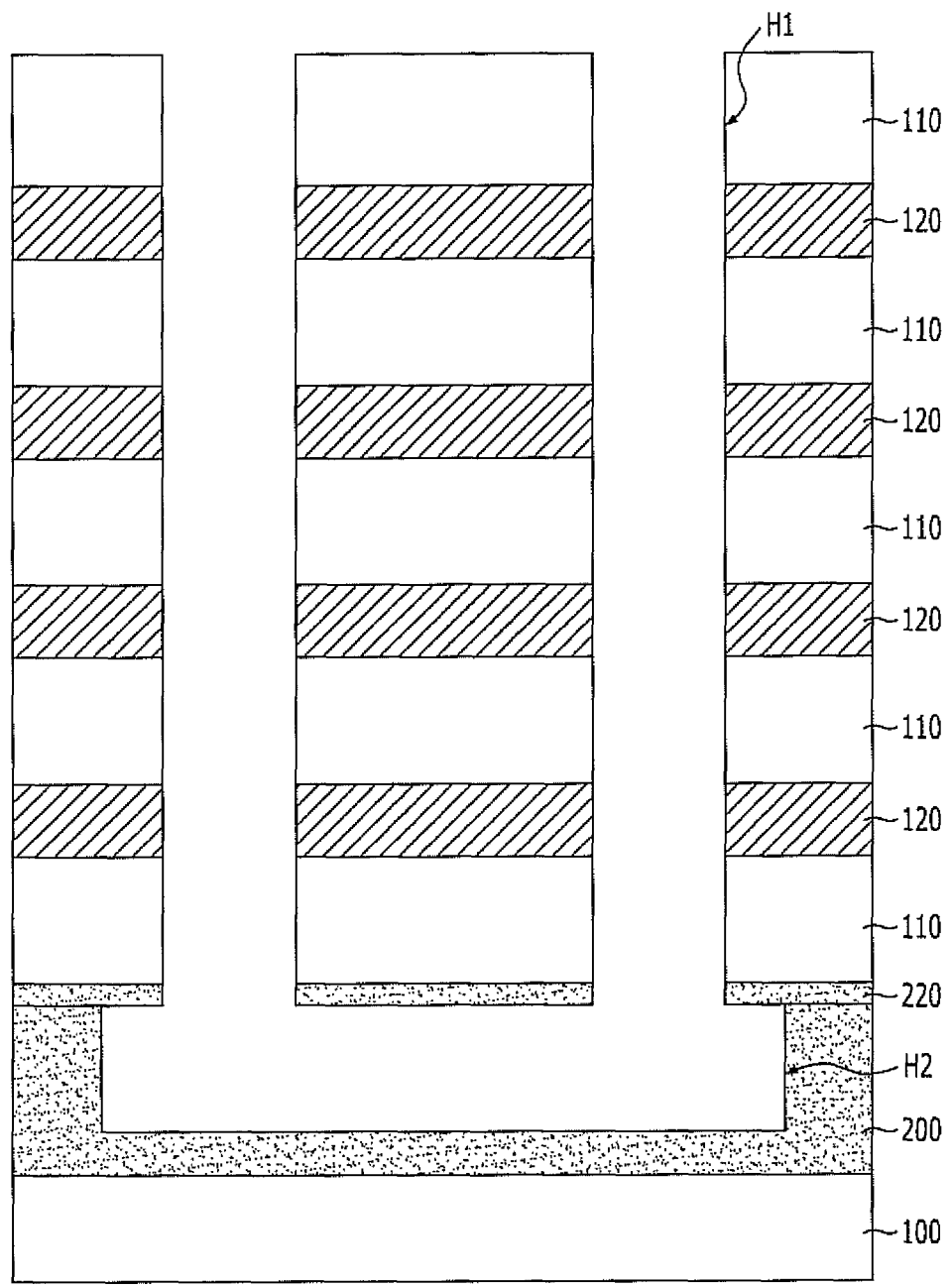

Referring to FIG. 5C, the gate structure and the second pass gate electrode layer 220 are selectively etched to form a pair of channel holes H1 exposing the sacrificial layer pattern 210. The pair of channel holes H1 provide a space in which a channel layer (to be described below) is to be formed, and may be arranged at each sacrificial layer pattern 210.

The sacrificial layer pattern 210, exposed by the pair of the channel holes H1, is removed. At this time, a wet etching process, using an etching selectivity that is substantially the same as the etching selectivity of the first and second pass gate electrode layers 200 and 220, and the gate structure may be performed to remove the sacrificial layer pattern 210. As the result of this process, a sub-channel hole H2, coupling the pair of channel holes H1, is formed in the space where the sacrificial layer pattern 210 was removed.

Figure 5D:
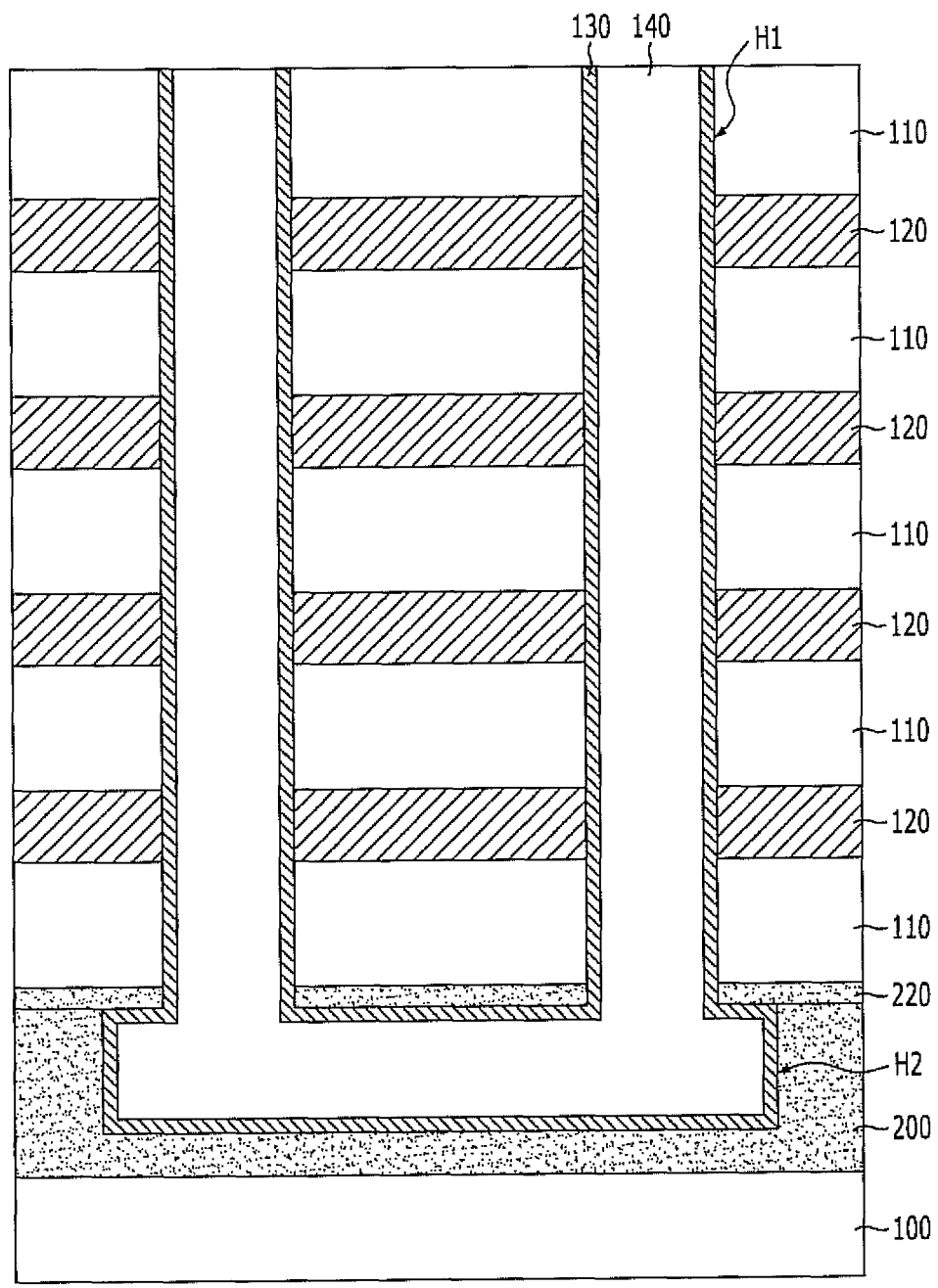

Referring to FIG. 5D, a memory layer 130 and a channel layer 140 are sequentially formed along the inner walls of the pair of channel holes H1 and the sub channel hole H2.

Here, the memory layer 130 may be formed by sequentially depositing a charge blocking layer, a charge trap layer, and a tunnel insulation layer, and may have a triple layer structure of ONO. Meanwhile, the channel layer 140 may be divided into a main channel layer, which may be used as a channel of a memory cell or select transistor, and a sub channel layer used as a channel of a pass transistor. The channel layer 140 may be formed of a semiconductor material, such as polysilicon.

Figure 5E:
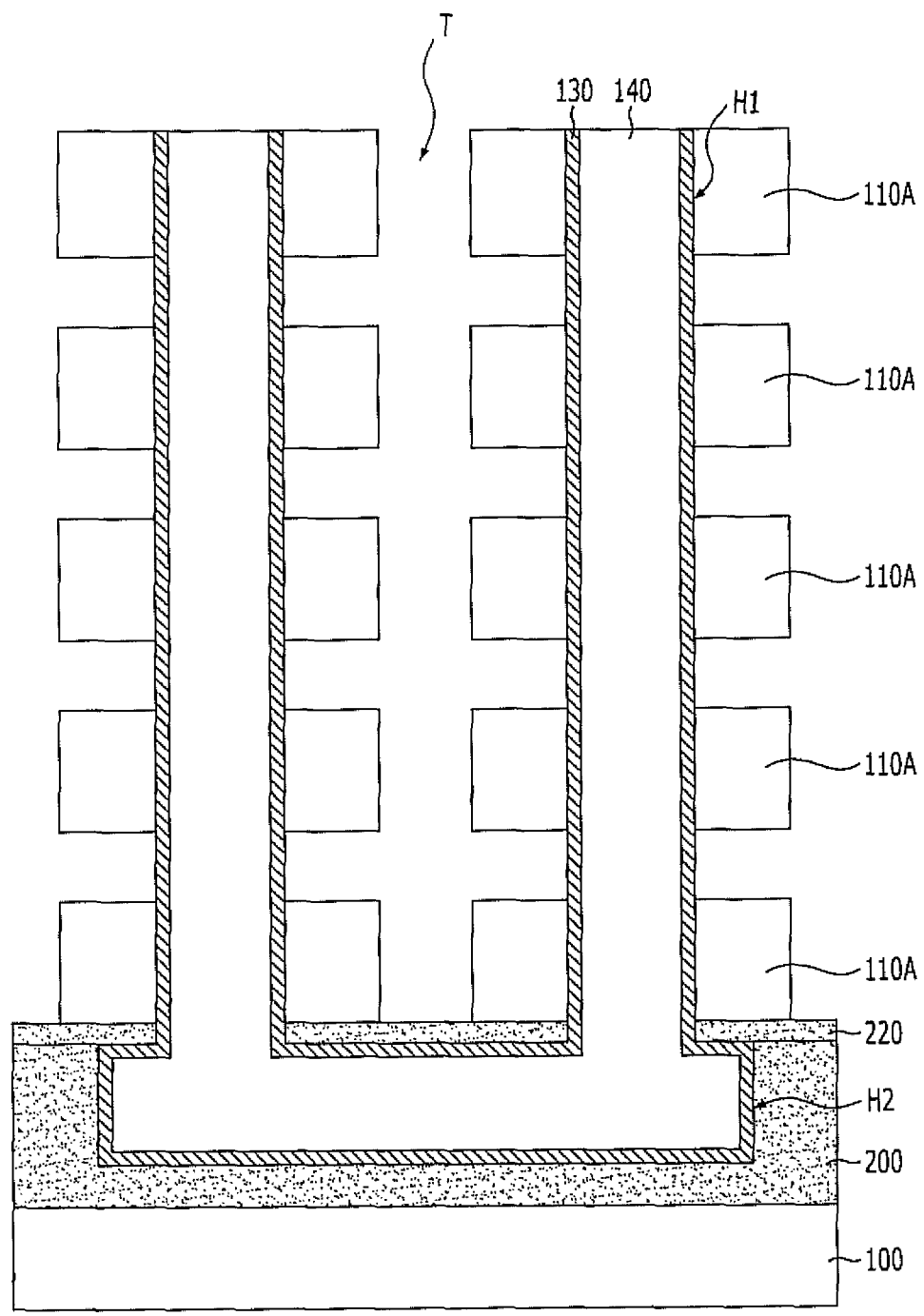

Referring to FIG. 5E, the gate structure at both sides of the channel hole H1 is selectively etched to form a plurality of slit holes T passing through the interlayer dielectric layers 110 and the sacrificial layers 120 (not shown). The plurality of slit holes T may have a slit shape extending in a direction crossing the cross-section of FIG. 5E and may be arranged in parallel to each other.

The sacrificial layers 120 and the interlayer dielectric layers 110, exposed through the slit holes T, are removed using a wet etching process. The remaining interlayer dielectric layer 110 is referred to as an interlayer dielectric layer pattern 110A.

Figure 5F:
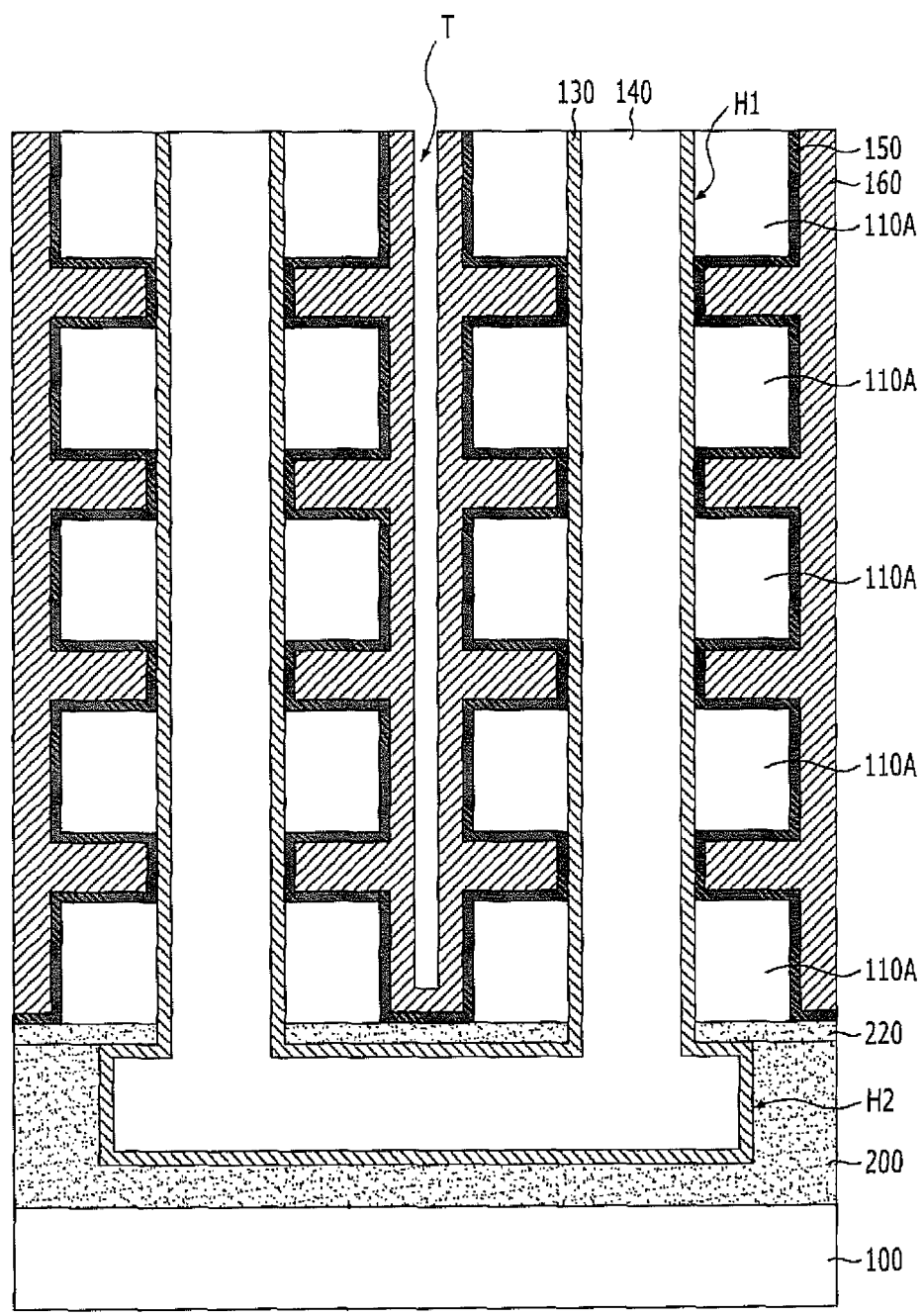

Referring to FIG. 5F, a barrier metal layer 150 is formed along the inner wall of the slit hole T, in the spaces formed when the sacrificial layers 120 were removed. The barrier metal layer 150 may be formed by conformally depositing TIN, for example.

A first gate electrode conductive layer 160 is formed on the barrier metal layer 150, in the spaces formed when the sacrificial layers 120 were removed. The first gate electrode conductive layer 160 may be formed by depositing a conductive material, such as metal, using, for example, atomic layer deposition (ALD) or chemical vapor deposition (CVD).

Figure 5G:
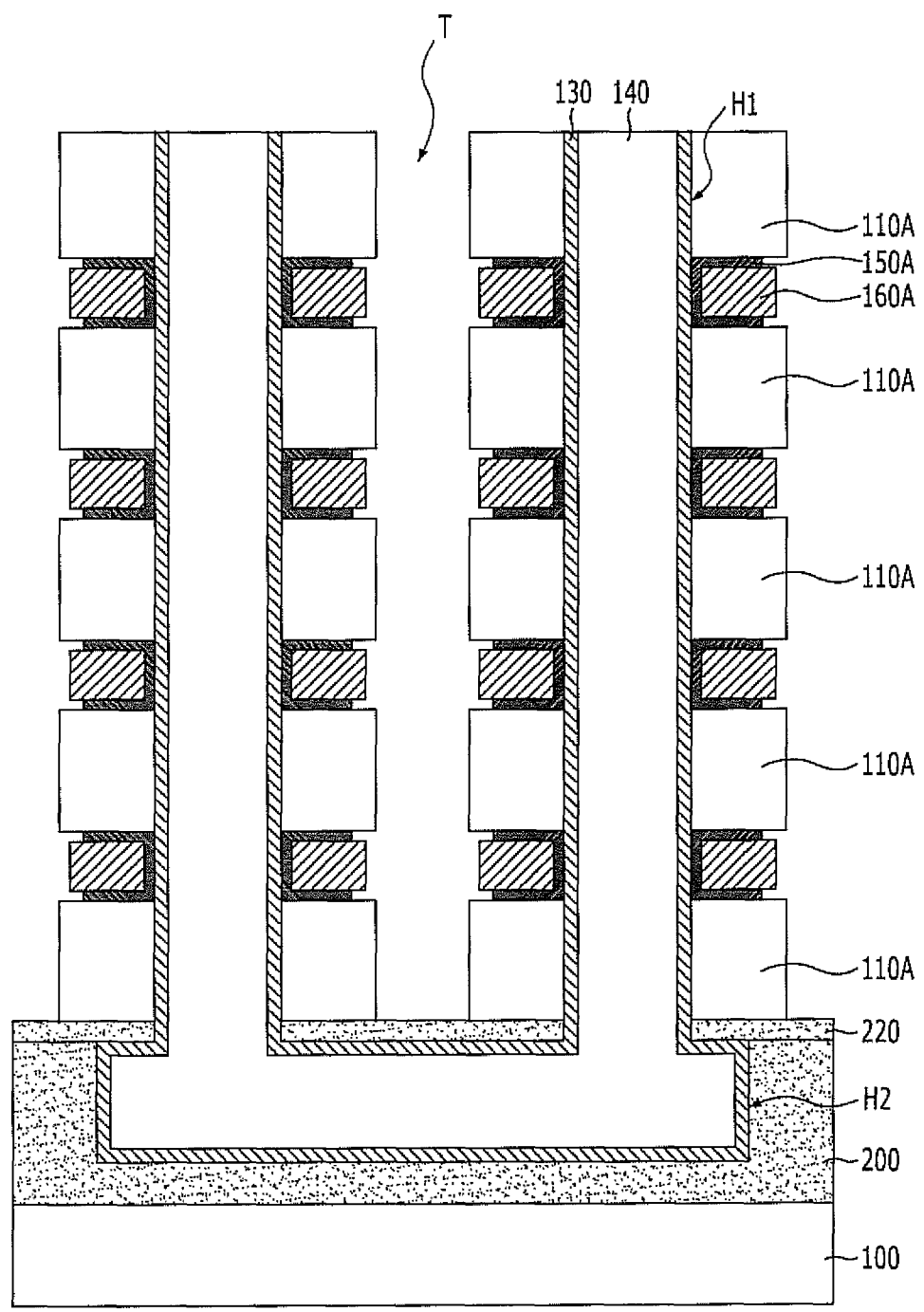

Referring to FIG. 5G, the barrier metal layer 150 and the first gate electrode conductive layer 160 from FIG. 5F are separated into the respective layers by etching the barrier metal layer 150 and the first gate electrode conductive layer 160 in the slit hole T until the side surfaces of the interlayer dielectric layer patterns 110A are exposed.

Here, the barrier metal layer 150 may be etched to a larger depth than the first gate electrode conductive layer 160, based on a difference in etch rate between the barrier metal layer 150 and the first gate electrode conductive layer 160. The etched barrier metal layer 150 and the etched first gate electrode conductive layer 160, both of which remain between the interlayer dielectric layer patterns 110A, are referred to as a barrier metal layer pattern 150A and a first gate electrode layer 160A, respectively.

Figure 5H:
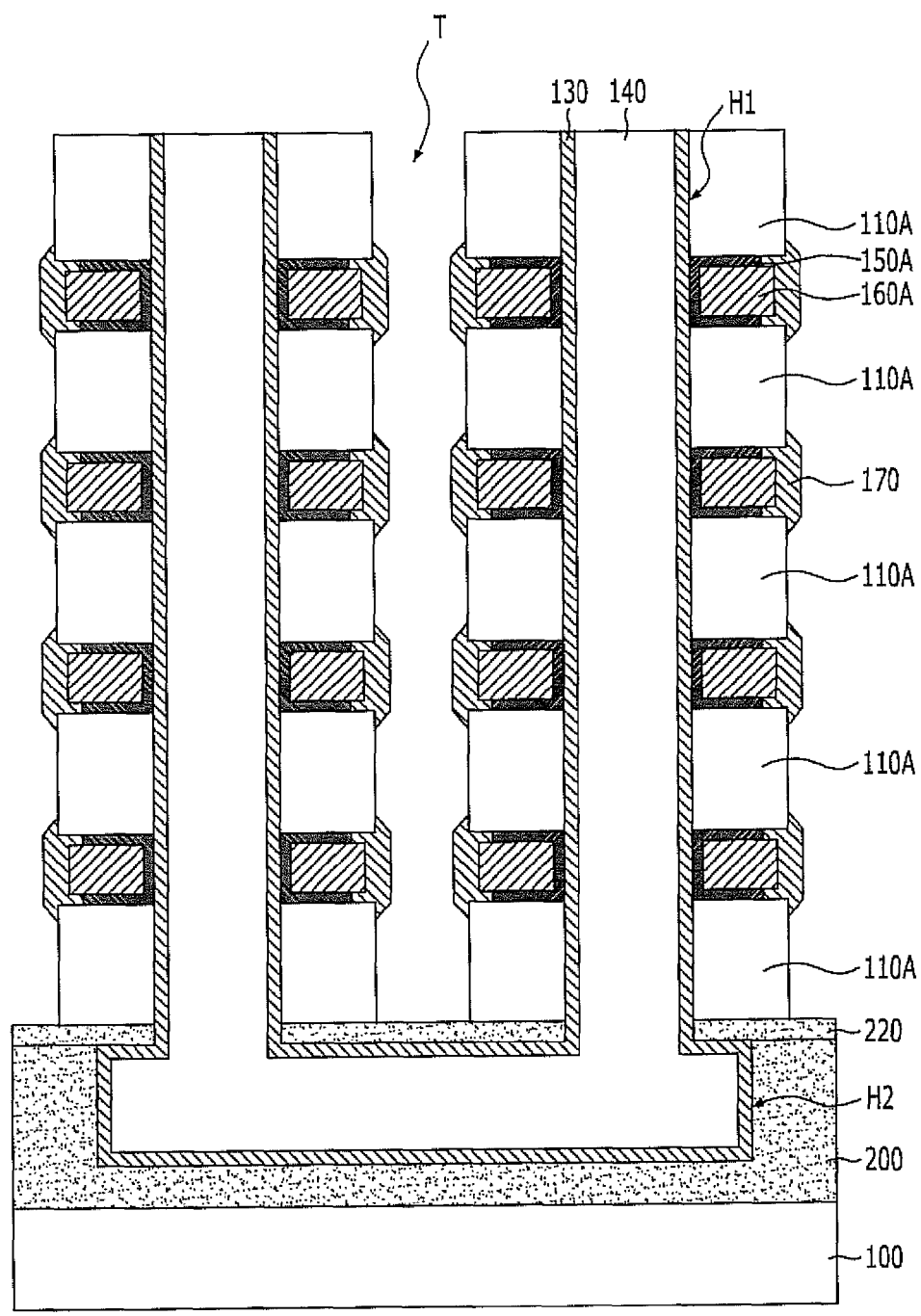

Referring to FIG. 5H, a second gate electrode layer 170 is formed to cover the first gate electrode layer 160A. The second gate electrode layer 170 protrudes from the interlayer dielectric layer pattern 110A and may have a larger width in a direction perpendicular to the surface of the substrate 100 than the first gate electrode layer 160A.

In particular, the second gate electrode layer 170 may include a metal or the like, and may be formed by selectively depositing bulk tungsten without tungsten nucleation. As the result of this process, a gate electrode layer, including the first gate electrode layer 160A and the second gate electrode layer 170 coupled to the first gate electrode layer 160A, is formed.

The fourth embodiment of the present invention, as shown in FIG. 5H, is different from the first embodiment of the present invention in that the pass gate electrode, including the first and second pass gate electrode layers 200 and 220, is formed under the gate structure, and the pass gate electrode has the sub-channel layer coupling the pair of main channel layers.

Figure 6:
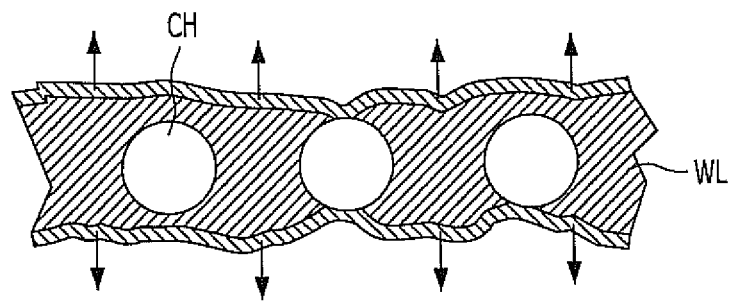
FIG. 6 is a cross-sectional view of the nonvolatile memory device in accordance with the embodiments of the present invention.
Figure 7A:
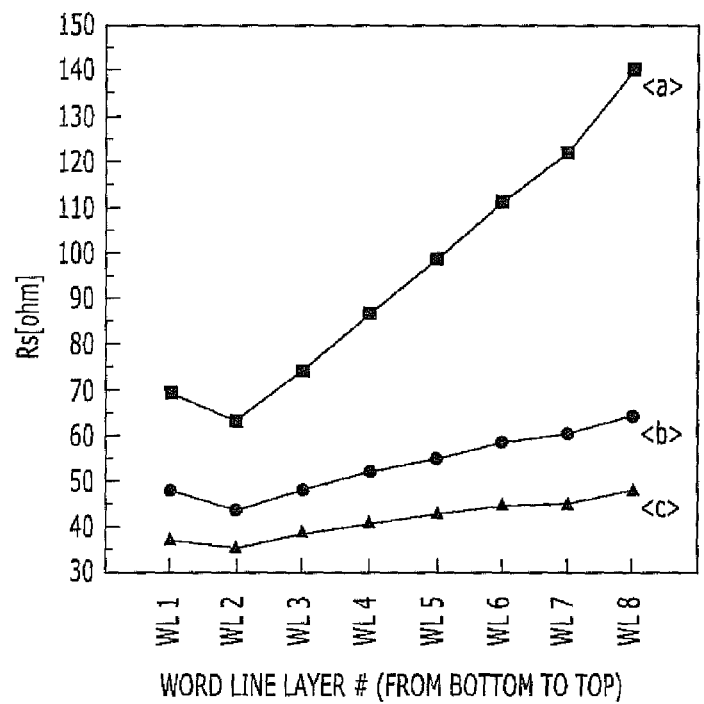
FIGS. 7A and 7B are graphs showing results obtained by measuring surface resistance of a word line.
Figure 7B:
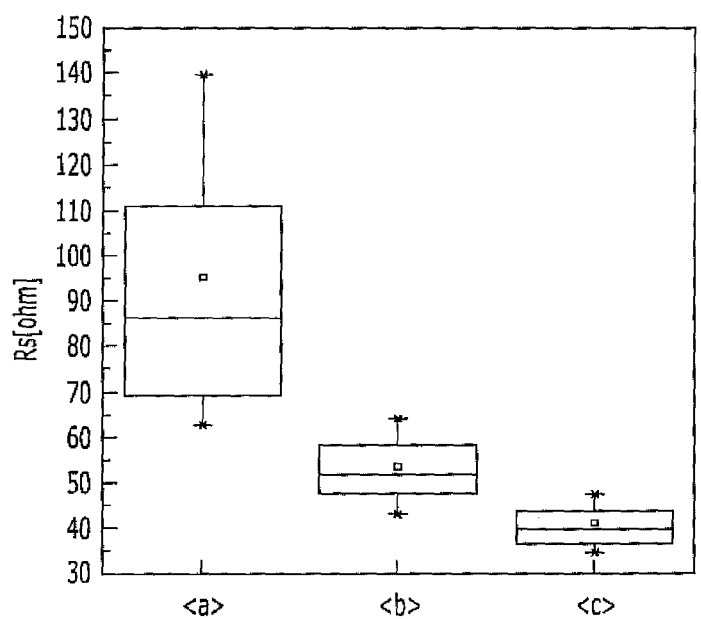

FIG. 6 is a cross-sectional view of the nonvolatile memory device in accordance with the embodiments of the present invention. FIGS. 7A and 7B are graphs showing results obtained by measuring surface resistance Rs of a word line.

Referring to FIG. 6, as the second gate electrode layer is formed by selectively depositing a metal such as tungsten, the volume of the gate electrode layer of the memory cell, that is, the word line WL increases in an arrow direction. Accordingly, it is possible to prevent an opening or resistance increase of the word line WL, which was the problem of the conventional nonvolatile memory device.

Referring to FIGS. 7A and 7B, <a> indicates word line surface resistance Rs of the conventional nonvolatile memory device, <b> indicates word line surface resistance Rs of the nonvolatile memory device in accordance with the embodiments of the present invention, in which bulk tungsten is selectively deposited to a thickness of 75 Å, and <c> indicates word line surface resistance Rs of the nonvolatile memory device in accordance with the embodiments of the present invention, in which bulk tungsten is selectively deposited to a thickness of 150 Å.

Here, in the cases of <b> and <c>, a difference in surface resistance Rs between a top word line and a bottom word line is less than in the case of <a>. Specifically, the difference in surface resistance Rs is reduced by 38% in the case of <b> and 52% in the case of <c>, as compared with the case of <a>.

In accordance with the embodiments of the present invention, the volume of the gate electrode layer may be increased without an electrical bridge between the gate electrode layers, which makes it possible to reduce the resistance of the gate electrode layer.

While the present invention has been described with respect to the specific embodiments, it will be apparent to those skilled in the art that various changes and modifications may be made without is departing from the spirit and scope of the invention as defined in the following claims.

What is claimed is:
1. A nonvolatile memory device, comprising:
a substrate;

a channel layer formed on the substrate, which protrudes perpendicularly from the surface; and a plurality of interlayer dielectric layers and a plurality of gate electrode layers alternately stacked along the channel layer, wherein a portion of each of the plurality of gate electrode layers protrude from the surface of the plurality of interlayer dielectric layers.

2. The nonvolatile memory device of claim 1, wherein each of the gate electrode layers comprises:

a first gate electrode layer positioned between two of the plurality of interlayer dielectric layers; and a second gate electrode layer protruding from the interlayer dielectric layers and coupled to the first gate electrode layer.

3. The nonvolatile memory device of claim 2, wherein the second gate electrode layer has a larger width in a direction perpendicular to a top surface of the substrate than a width of the first gate electrode layer.

4. The nonvolatile memory device of claim 1, further comprising:

a barrier metal layer interposed between each interlayer dielectric layer and each gate electrode layer.

5. The nonvolatile memory device of claim 1, further comprising:

a memory layer interposed between the channel layer and each gate electrode layer.

6. The nonvolatile memory device of claim 1, further comprising:

a sub-channel layer that couples a pair of channel layers;

a pass gate electrode coming into contact with the sub-channel layer; and a gate dielectric layer interposed between the pass gate electrode and the sub-channel layer.

7. The nonvolatile memory device of claim 6, wherein the pass gate electrode comprises a conductive layer formed over the sub-channel layer.

8. A method for fabricating a nonvolatile memory device, the method comprising:

alternately stacking a plurality of interlayer dielectric layers and a plurality of sacrificial layers over a substrate;

forming a channel hole by selectively etching the plurality of interlayer dielectric layers and the plurality of sacrificial layers;

forming a channel layer in the channel hole;

farming a slit hole adjacent to the channel hole so that the slit hole passes through the plurality of interlayer dielectric layers and the plurality of sacrificial layers;

removing the plurality of sacrificial layers exposed through the slit hole to form a plurality of spaces;

forming a first gate electrode layer in each of the plurality of spaces; and forming a plurality of second gate electrode layers, each coupled to a corresponding first gate electrode layer, so that each of the plurality of second gate electrode layers protrudes from the plurality of interlayer dielectric layers.

9. The method of claim 8, wherein the plurality of second gate electrode layers are formed to have a larger width in a direction perpendicular to a top surface of the substrate than a width of the first gate electrode layer.

10. The method of claim 8, the method further comprising:

forming protruding portions of the plurality of first gate electrode layers by partially removing the interlayer dielectric layer so that the plurality of first gate electrode layers protrudes from the plurality of interlayer dielectric layers, and wherein the plurality of second gate electrode layers are formed to surround corresponding protruding portions of the plurality of first gate electrode layers.

11. The method of claim 8, further comprising:

forming a barrier metal layer on inner walls of the plurality of spaces.

12. The method of claim 11, further comprising:

partially etching the barrier metal layer after the forming of the plurality of first gate electrode layers.

13. The method of claim 8, further comprising:

forming a memory layer on the sidewall of the channel hole.

14. The method of claim 8, further comprising:

forming a pass gate electrode over the substrate before the stacking of the plurality of interlayer dielectric layers and the plurality of sacrificial layers.

15. The method of claim 14, further comprising:

forming sub-channel holes that each couples a pair of channel holes with each other in the pass gate electrode.

16. The method of claim 8, wherein the plurality of second gate electrode layers are formed by selectively depositing tungsten.

* * * * *